United States Patent [19]

Watanabe et al.

[11] Patent Number: 4,713,690
[45] Date of Patent: Dec. 15, 1987

[54] SAMPLING CLOCK PHASE CORRECTION CIRCUIT OF VIDEO SIGNAL

[75] Inventors: Shinya Watanabe; Fumihiro Tanaka; Kaneo Yamaguchi; Yoshio Shimada; Kenichi Matsushima, all of Tokyo, Japan

[73] Assignee: Seiko Instruments & Electronics Ltd., Tokyo, Japan

[21] Appl. No.: 912,944

[22] Filed: Sep. 29, 1986

[30] Foreign Application Priority Data

Oct. 1, 1985 [JP] Japan .................................. 60-218230

[51] Int. Cl.⁴ .............................................. H04N 5/04
[52] U.S. Cl. ..................... 358/148; 358/158; 358/264; 340/814
[58] Field of Search ............... 358/148, 150, 152, 158, 358/264, 319, 320, 325, 337; 340/814; 455/111, 118, 119, 120

[56] References Cited

U.S. PATENT DOCUMENTS 3,637,936  1/1972  Krause .................................. 358/325
4,631,600 12/1986  Fukui .................................... 358/320

OTHER PUBLICATIONS

IEEE Transactions on Broadcasting, vol. BC-17, No. 1, "A New Technique for Time-Base Stabilization of Video Recorders"; by Coleman, Mar. 1971, pp. 29–36.

Primary Examiner—James J. Groody
Assistant Examiner—Michael D. Parker
Attorney, Agent, or Firm—Bruce L. Adams; Van C. Wilks

[57] ABSTRACT

A sampling clock phase correction circuit of video signal to keep stably a phase of a sampling clock to an image signal. A delayed signal of a video sync signal is employed for a reference signal of a sampling clock generation circuit. The delay quantity of the video sync signal is controlled to sample stably the video image signal according to the comparison and discrimination of a phase relation between a sampling clock signal and a video sync signal by a phase detection circuit and a CPU circuit. A precise phase correction where a characteristic change of circuit elements by a temperature drift or the like is compensated can be attained even for a high frequency video signal exceeding 100 MHz.

2 Claims, 6 Drawing Figures

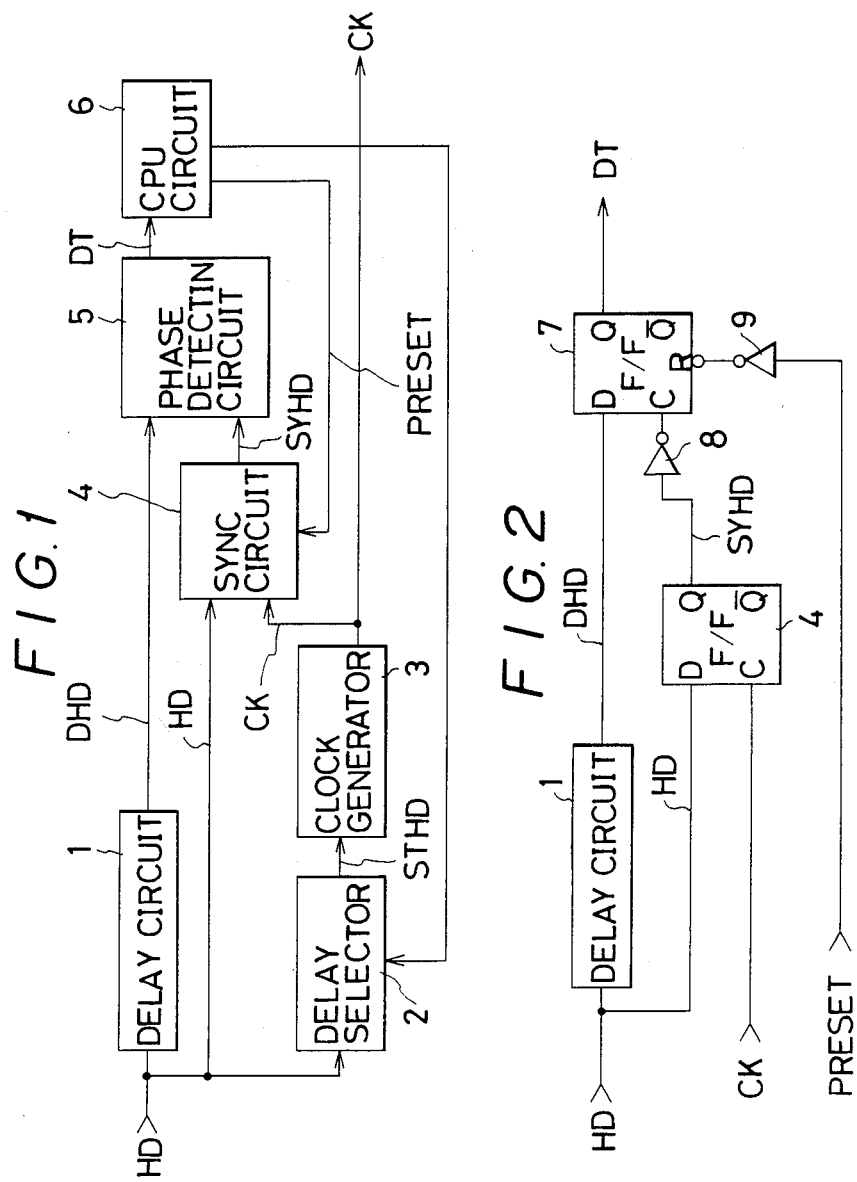

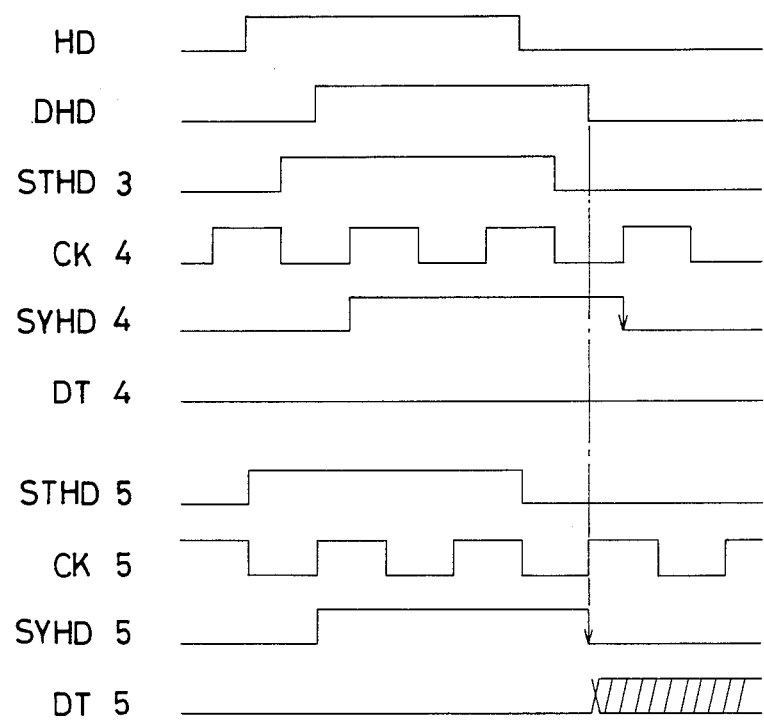

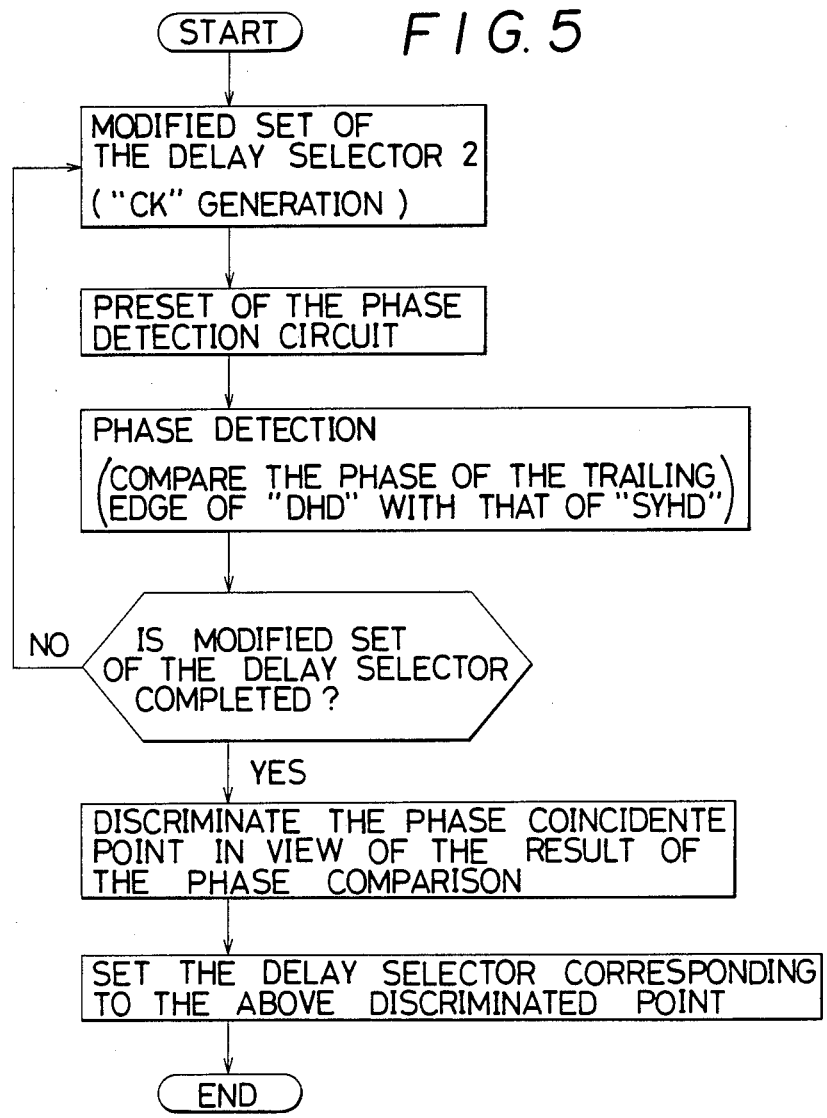

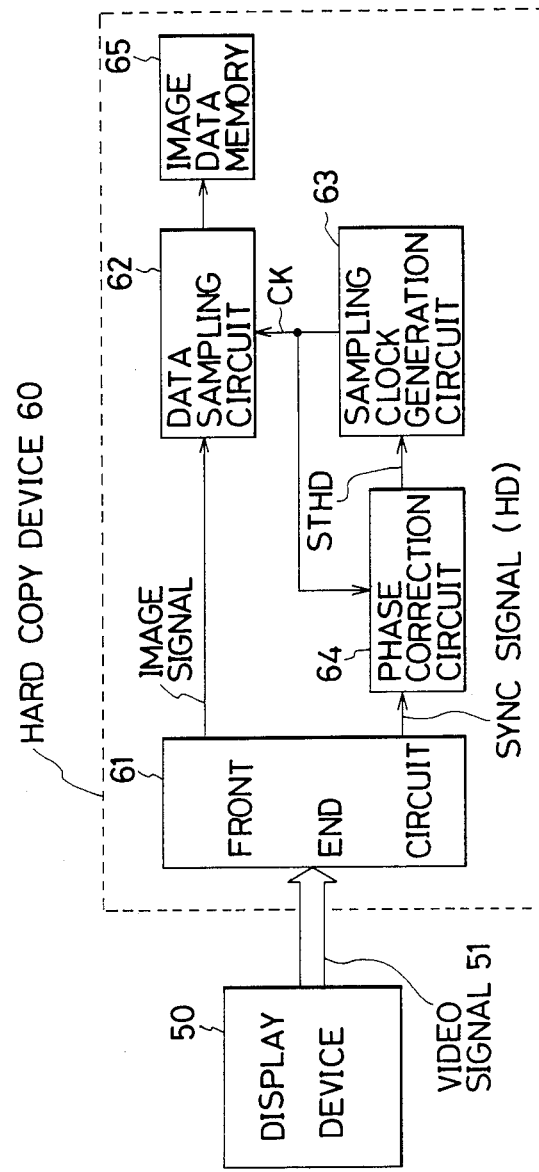

SAMPLING CLOCK PHASE CORRECTION CIRCUIT OF VIDEO SIGNAL

BACKGROUND OF THE INVENTION (1) Field of the invention

This invention relates to a phase correction circuit of a sampling clock when a video signal from a video signal generation apparatus such as a graphic display is sampled by an output device such as a hard copy device.

(2) Background of the Invention

Output devices for conventional video signal generation apparatuses deal only with low frequency and strict phase correction including a temperature compensation employing a samping clock pulse phase has not been seen as necessary. In addition, re-adjustment has not been necessary, either, once the phase relation between the video signal and the sampling clock pulse has been made.

In graphic display devices used in recent CAD1CAM applications, a video frequency exceeding 100 MHz is used and in such an application, it is necessary to reproduce a picture with a high level of fidelity. In such a frequency range, however, a delay change quantity of circuit elements due to a temperature change exerts significant influences, and it is difficult even by use of a sampling clock pulse generation circuit relying upon a high precision PLL circuit to keep a phase drift below several nano seconds. For this reason, phase correction means must be used for video signals above 100 MHz.

SUMMARY OF THE INVENTION

It is therefore an object of this invention to provide a sampling clock phase correction circuit which stably samples the video signals in a high frequency range preventing a characteristic change of circuit elements due to a temperature change.

In order to solve the problems described above, the present invention makes it possible to correct the phase of the sampling clock pulse signal by means for detecting and discriminating the phase relation between a sampling clock pulse signal and a horizontal sync signal and a circuit for arbitrarily setting the phase of the sync signal which is to serve as a reference input signal of a clock generation circuit.

In accordance with the construction described above, the phase delay quantity of the sync signal is changed on the basis of the discrimination result of phase detection and phase correction is made so that the output of the detection circuit always keeps the same state. In this manner, the phase relation between the input sync signal and the samping clock pulse signal can be directly kept constant while the phase relation between the video image signal which has a predetermined phase relation with the sync signal and the samping clock pulse signal can be indirectly kept constant.

BRIEF DESCRIPTION OF THE DRAWINGS

FIG. 1 is a block diagram of a clock phase correction circuit in accordance with the present invention;

FIG. 2 is a detailed circuitry diagram of a phase detection circuit;

FIG. 4 is a signal timing chart useful for explaining when the phase changes;

FIG. 5 is an operational flow chart of one embodiment of this invention; and

FIG. 6 shows a hard copy device constructed according to the principles of the present invention.

DETAILED DESCRIPTION OF THE PREFERRED EMBODIMENTS

Figure 3:
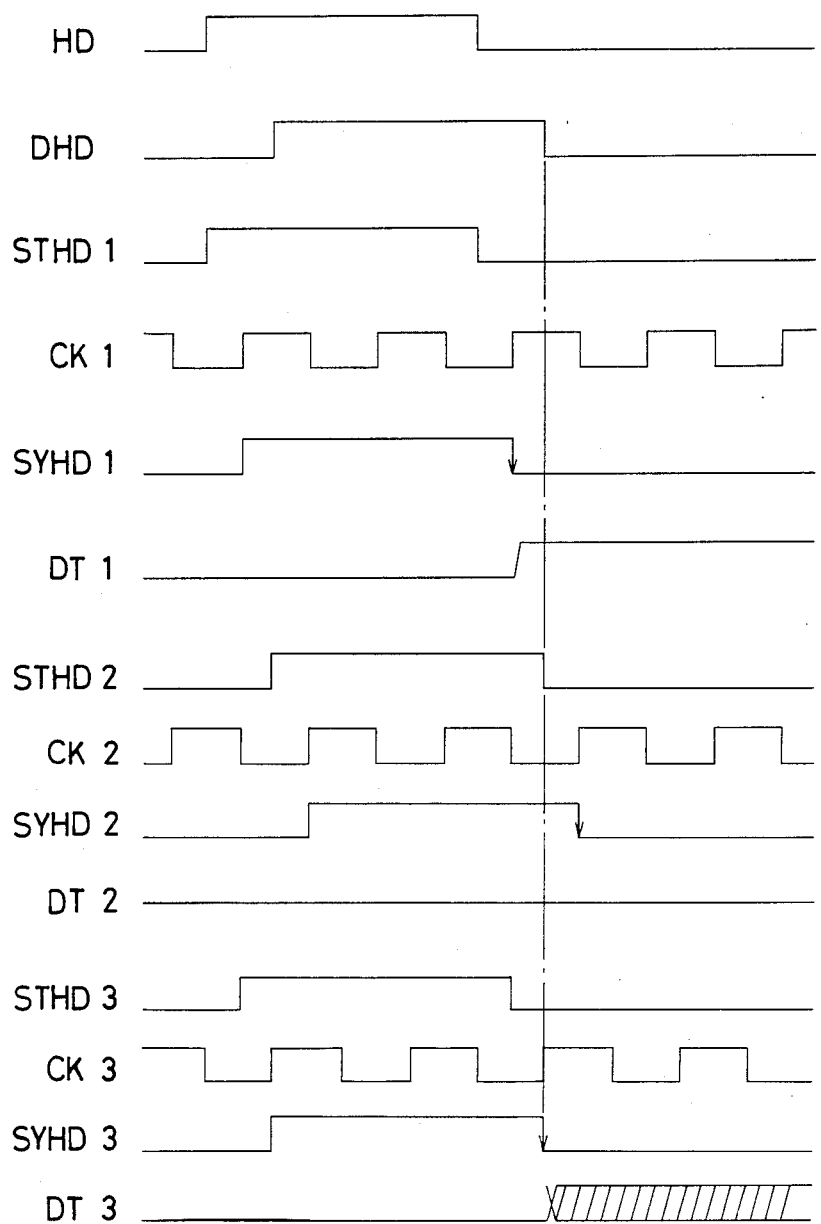
FIG. 3 is a signal timing chart useful for explaining the operation of FIG. 1 and FIG. 2.

Hereinafter, one embodiment of the present invention will be described with reference to the accompanying drawings.

FIG. 1 is a block diagram of a clock phase correction circuit in an embodiment of the present invention. Reference numeral 1 represents a delay circuit using a delay line or the like. This delay circuit 1 outputs a signal DHD prepared by delaying a horizontal sync signal HD by about a half of a sampling clock pulse width. Reference numeral 2 represents a delay selector which uses a delay line or the like and can arbitrarily select its delay quantity in a unit of about 1 nsec. Reference numeral 3 is a clock generation circuit which generates a sampling clock CK by the output signal STHD of the delay selector 2. Reference numeral 4 is a sync circuit which samples sync signal HD by sampling clock CK and generates a sampled horizontal sync signal SYHD which is in synchronism with CK; and reference numeral 5 is a phase detection circuit which compares the phase of signal DHD with that of signal SYHD and outputs "1" as a phase detection signal DT when signal SYHD is ahead of signal DHD and "0" when the former is behind the latter. Reference numeral 6 is a CPU (central processing unit) circuit which controls the delay quantity of the delay selector 2 by reference to DT.

FIG. 2 is a detailed circuitry diagram to show the operation of the phase detecting circuit 5. FIG. 2 includes the delay circuit 1 and sync circuit 4 of FIG. 1 to facilitate explanation. Reference numeral 7 is a D-Type flip-flop (D-F/F) which detects the phase of signal SYHD and compares it with that of signal DHD. The signal DHD is inputted to the D terminal of D-F/F, and the signal SYHD is input to clock terminal C of D-F/F through the inverter 8, and the compared signal of phase detection DT is outputted from the Q terminal. Moreover, a preparatory signal for phase comparison (PRESET) is inputted (see FIG. 1) to the R terminal through the inverter 9 from the CPU circuit.

FIG. 3 is a signal timing chart to show the operation of FIG. 1 and FIG. 2.

Next, the circuit operation will be described with reference to FIG. 3.

The signal DHD is later by the half period of signal CK than signal HD. STHD1 represents the state where the delay quantity by the delay selector 2 is zero and, where the leading edge of signal CK1 is later by ¼ pulse width of the clock pulse. SYHD1 is generated by sampling signal HD by signal CK1 and is later by ¼ clock pulse than signal HD. As a result, SYHD1 compared by the phase detection circuit 5 is ahead of DHD so that "1" is outputted as signal DT1.

Next, signal STHD2 represents the case where the delay quantity is ½ clock pulse. In this case, CK2 and SYHD2 are later by ¾ clock pulse than signal HD and signal SYHD2 is behind signal DHD so that "0" is outputted as signal DT2.

Similarly, signal STHD3 represents the case where the delay quantity is ¼ clock pulse. As shown in the timing chart signal DHD and signal SYHD3 have the same phase and the output of signal DT3 is unstable.

However, CK3 for sampling HD exhibits the phase deviation of ½ clock pulse with respect to HD, and hence sampling HD can be made most stably.

Next, the correction procedure when the phase of signal CK changes with respect to signal STHD3 explained in FIG. 3 will be explained with reference to FIG. 4.

Signal CK4 exhibits the phase deviation of ½ clock pulse with respect to signal STHD3. This shows that the delay of ¼ clock pulse further occurs due to a temperature drift or the like from the delay quantity of ¼ clock pulse of signal CK with respect to signal STHD shown in FIG. 3. As a result, signal SYHD4 is behind signal DHD and signal DT4 becomes "0". The CPU checks this state and changes the delay quantity of signal SYHD so as to attain the same state as that of signal DT3 shown in FIG. 3. This state is represented by signals STHD5, CK5 and SYHD5, where the phase of SYHD5 is coincident with that of signal DHD so that the phase of signal CK5 is completely coincident with the phase of signal CK3 shown in FIG. 3.

FIG. 5 is an operational flow chart of the phase correction procedure described above.

Accordingly, if the time delay quantity is controlled so that signal DT is kept unstable, the sampling clock signal CK can always keep the optimum phase relation with respect to the sync signal HD.

The above described sampling clock pulse signal phase correction circuit of a video signal in accordance with this invention is included in a hard copy device as shown in FIG. 6.

According to the present invention, the phase of the input sync signal and that of the sampling clock pulse and eventually, the phase relation between the video signal which has a predetermined phase relation with the sync signal and the sampling clock pulse, can be always kept constant in a unit of adjustment of about 1 nsec. Accordingly, video signals above 100 MHz can be sampled stably, and a picture can be reproduced with high fidelity.

What is claimed is:

1. In an output device such as a hard copy device in a video signal generation apparatus such as a graphic display, a sampling clock pulse signal phase correction circuit for video signals comprising:
   (a) a video signal sampling clock generation circuit for producing a video signal sampling clock signal having a constant phase relation with respect to a reference input signal;
   (b) a phase detection circuit for comparatively detecting the phase of the video signal sampling clock signal from said sampling clock generation circuit and the phase of a video sync signal and producing an output detection signal; and
   (c) a CPU circuit for receiving the output detection signal and discriminating the advance and delay of the phase of the video signal sampling clock signal with respect to the phase of the video sync signal so that the phase of said reference input signal of said video signal sampling clock generation circuit is controlled in accordance with the result of detection of said CPU circuit so that the phase of said video signal sampling clock signal is changed and corrected relative to the phase of the video sync signal.

2. The sampling clock phase correction circuit of video signals as defined in claim 1; wherein said reference input signal employs a delayed horizontal sync signal of said video sync signal.

* * * * *